(12) United States Patent
Hsu et al.

(10) Patent No.: US 8,694,839 B2
(45) Date of Patent: Apr. 8, 2014

(54) METHOD AND SYSTEM FOR TESTING CHIPS

(75) Inventors: Hsiang-Che Hsu, Taipei Hsien (TW); Bowei Hsieh, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 191 days.

(21) Appl. No.: 12/938,392

(22) Filed: Nov. 3, 2010

(65) Prior Publication Data

US 2011/0047420 A1  Feb. 24, 2011

Related U.S. Application Data

(62) Division of application No. 11/668,440, filed on Jan. 29, 2007, now Pat. No. 7,853,843.

(30) Foreign Application Priority Data

Oct. 26, 2006 (TW) .............................. 95139525 A

(51) Int. Cl.
*G11C 29/00* (2006.01)
*G06F 11/00* (2006.01)
*G01R 31/08* (2006.01)
*G08C 15/00* (2006.01)
*H04J 1/16* (2006.01)

(52) U.S. Cl.
USPC .............. 714/712; 714/43; 370/248; 370/282

(58) Field of Classification Search
USPC ......... 714/712, 716, 717, 724, 733–734, 799, 714/821, 43, 44, 46; 370/242, 248, 249, 370/282, 276
See application file for complete search history.

(56) References Cited

U.S. PATENT DOCUMENTS

| | | | |
|---|---|---|---|
| 5,956,370 A | 9/1999 | Ducaroir | |
| 6,631,486 B1 * | 10/2003 | Komatsu et al. | 714/724 |
| 6,871,311 B2 * | 3/2005 | Watanabe et al. | 714/738 |
| 7,043,674 B2 | 5/2006 | Rearick | |
| 7,049,839 B1 | 5/2006 | Hsiao | |
| 7,272,114 B1 * | 9/2007 | Barkan | 370/248 |
| 7,296,202 B2 * | 11/2007 | Richter | 714/728 |
| 7,587,651 B2 | 9/2009 | Kuo | |
| 2002/0030531 A1 | 3/2002 | Jaynes | |
| 2004/0049721 A1 | 3/2004 | Laake | |
| 2005/0193302 A1 * | 9/2005 | Arguelles et al. | 714/733 |

FOREIGN PATENT DOCUMENTS

| | | |
|---|---|---|
| TW | 564309 | 12/2003 |
| TW | 200624843 | 7/2006 |

* cited by examiner

*Primary Examiner* — Christine Tu
(74) *Attorney, Agent, or Firm* — Winston Hsu; Scott Margo

(57) ABSTRACT

A chip operating method is provided which includes enabling a transmission mechanism or a receiving mechanism of the chip while normally operating the chip. The method further includes enabling both of the transmission mechanism and the receiving mechanism of the chip while testing the chip.

6 Claims, 2 Drawing Sheets

METHOD AND SYSTEM FOR TESTING CHIPS

CROSS REFERENCE TO RELATED APPLICATIONS

This application is a division of U.S. application Ser. No. 11/668,440 filed Jan. 29, 2007, which is incorporated herein by reference in its entirety.

BACKGROUND OF THE INVENTION

1. Field of the Invention

The disclosure relates to a system and related method for testing chips, and, more particularly, is related to a system for testing high speed chip and a method thereof.

2. Description of the Prior Art

In computer systems, data is transacted between devices via the buses. For instance, in a computer system, a central processing unit (CPU) bridges a number of peripherals, such as hard disk drivers, compact disc (CD) drivers, display cards and etc, through a chipset, and the connections between the CPU, the chipset, and the peripherals are via the buses for transferring data. Regarding to the requirements of efficiency and utility rate, the computer system with high performance is designed. Therefore, the bus speed is raised to meet the requirements of transacting data quickly. As a result, in modern computer system, a high speed bus, for example the Front Side Bus (FSB), is used between CPU and the chipset. According to the FSB bus specification, the data is transmitted at the high speed of GHz level, such as 1066 MHz to 1333 MHz.

In order to ensure the correct operations of the electronic devices, the input/output functions are tested when manufacturing the electronic device. When testing the electronic device, an external testing device is introduced in one end of the electronic device; therefore a testing data is transmitted from the testing device to the electronic device and then the testing data is received in another end of the electronic device. Finally, the transmitted testing data and the received testing data is compared to determined whether the electronic device is correctly operated. Since the high speed bus is required in the modern electronic devices, the high speed testing device for testing high speed input/out functions is required. However, the high speed testing device is pretty expansive, and the cost of the electronic device is increased.

Therefore, it has become an important issue to provide a system and related method for testing an electronic device with a high-speed bus interface.

SUMMARY OF THE INVENTION

A chip operating method is provided which includes: enabling a transmission mechanism or a receiving mechanism of the chip while normally operating the chip; and enabling both of the transmission mechanism and the receiving mechanism of the chip while testing the chip.

The various objects and advantages of the present invention will be more readily understood from the following detailed description when read in conjunction with the appended drawing, in which:

These and other objectives of the present invention will no doubt become obvious to those of ordinary skill in the art after reading the following detailed description of the preferred embodiment that is illustrated in the various figures and drawings.

DETAILED DESCRIPTION

The present invention provides a method and related system for testing a chip with a high speed I/O functions under a low-cost and low-speed testing environment.

The method and related apparatus for chip test according to the embodiments of the invention will be apparent from the following detailed description, which proceeds with reference to the accompanying drawings, wherein the same references relate to the same elements.

Figure 1:
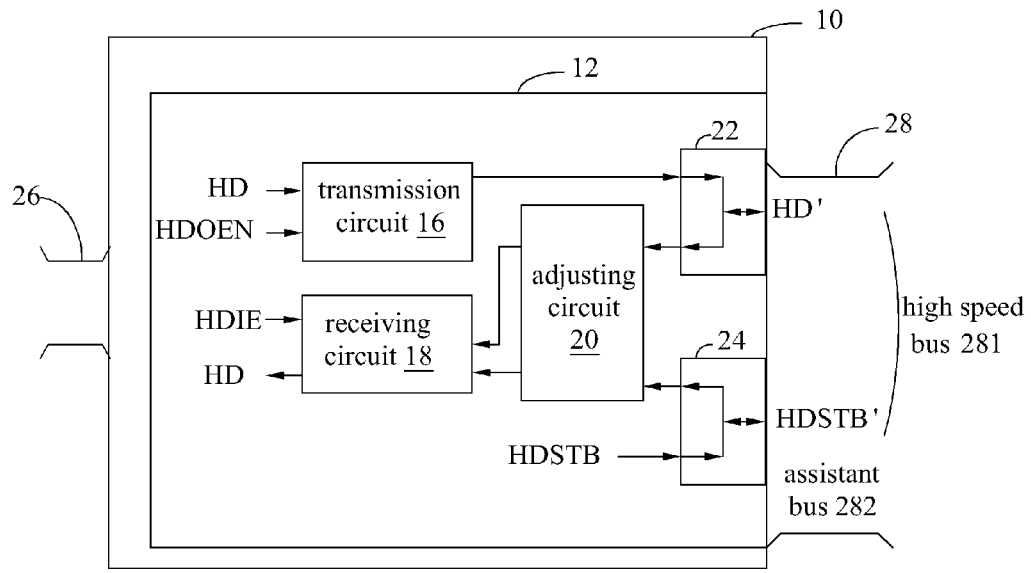
FIG. 1 is a schematic diagram of a chip.

FIG. 1 shows a schematic diagram of a chip 10 according to the invention. Assume that the chip 10 is a chipset connected between a host bus 28 (ex. Front Side bus) and a low speed bus 26 (ex. memory bus or PCI bus). The host 28 has a high speed bus 281 for delivering data and strobe signals in high speed and an assistant bus 282 for delivering information such as command and address in low speed.

As shown in FIG. 1, the chip 10 includes a high-speed bus interface circuit 12 connected to the host bus 28 for implement input and output functions of the chip 10. The high-speed bus interface circuit 12 includes: a transmission circuit 16 controlled by a transmission control signal HDOEN for performing a transmission mechanism of the chip 10 and a receiving circuit 18 controlled by a transmission control signal HDIE for performing a receiving mechanism of the chip 10. Otherwise, the high-speed bus interface circuit 12 further includes an adjusting circuit 20, a data connecting circuit 22 and a strobe signal connecting circuit 24.

In the present invention, the high speed bus 281 is bi-directional; therefore, the transmission circuit 16 could transmit data to the high speed bus 271 via the data connecting circuit 22; and the receiving circuit 18 could also receive data from the high speed bus 281 via the data connecting circuit 22. While transmitting data HD to the high speed bus 281, a strobe signal HDSTB is accordingly transmitted via the strobe signal connecting circuit 24. While receiving data HD' from the high speed bus 281, a strobe signal HDSTB' is also accordingly received via the strobe signal connecting circuit 24. Then the adjusting circuit 20 adjusts the timing relationship of the data HD' and the strobe signal HDSTB'; therefore the receiving circuit 18 could read out data HD' according to the strobe signal HDST B'. It is notice that while normally operating the chip 10, either the transmission mechanism or the receiving mechanism is performed at a time (i.e. either the transmission control signal HDOEN or the receiving control signal HDIE is enabled at a time).

Figure 2:
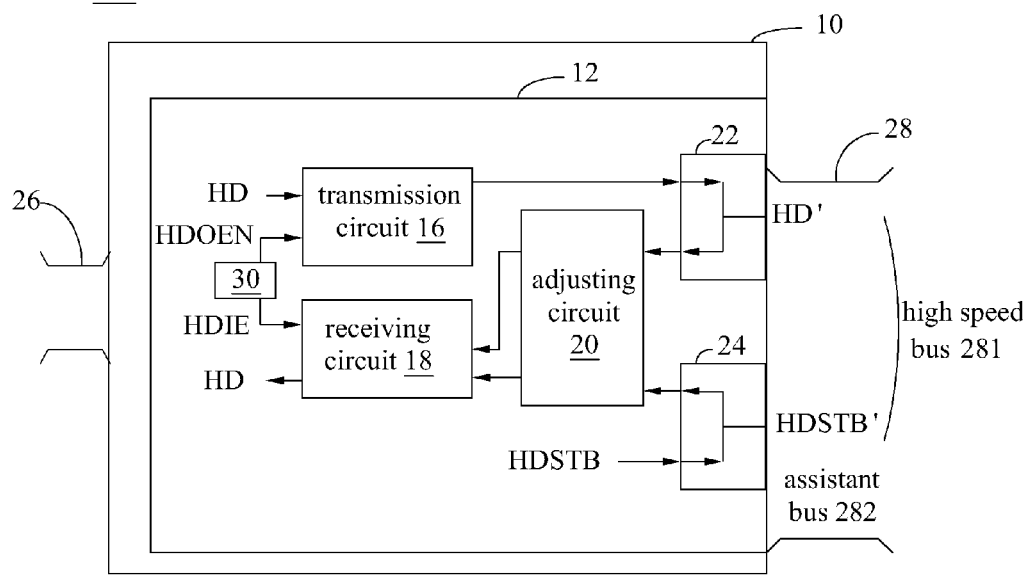
FIG. 2 is a schematic diagram of the testing system according to the embodiment of the present invention.

FIG. 2 shows a schematic diagram of the testing system 200 for the chip 10 according to one embodiment in the present invention. The testing system 200 includes a testing control circuit 30 connected to the high speed bus interface circuit 12. In the present invention, while testing the chip 10, the testing control circuit 30 enables both the transmission control signal HDOEN and the receiving control signal HDIE. Therefore, the transmission circuit 16 transmits a testing signal HDt according to the transmission control signal HDOEN; and the receiving circuit 18 then receives the testing signal HDt according to the receiving control signal HDIE.

That is to say, the transmission mechanism and the receiving mechanism are both performed; and an inner loop path is established while testing the chip 10; as a result, the testing signal transmitted by the transmission circuit 16 could be received by the receiving circuit 18 via the inner loop path.

Figure 3:
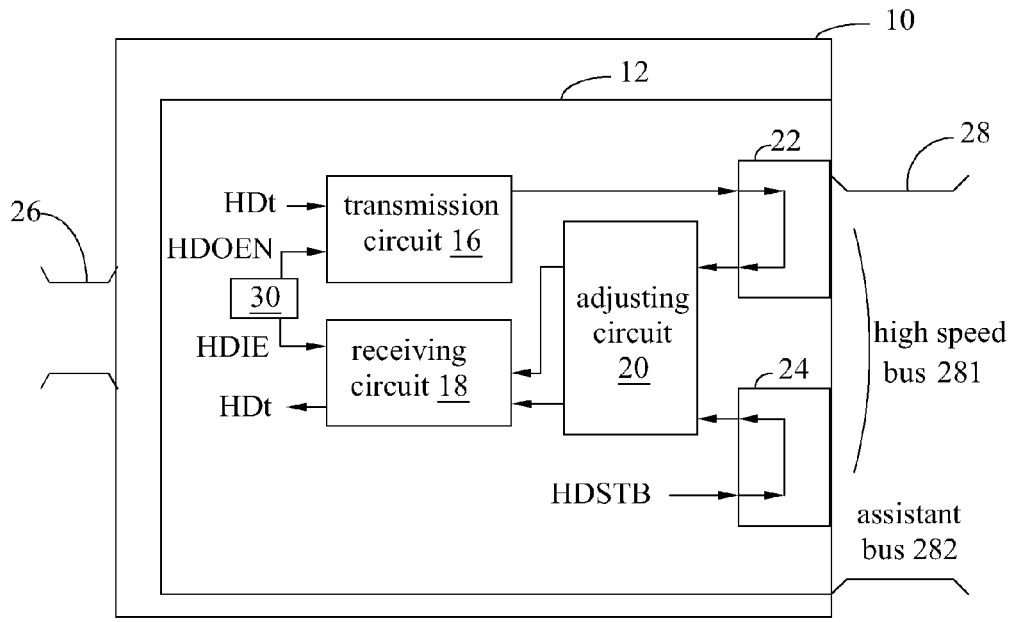
FIG. 3 is a detail schematic diagram of the testing system according to the embodiment of the present invention.

FIG. 3 shows more detail schematic diagram of the testing system 200 according to the present invention. While testing the chip 10, the testing signal HDt is transmitted by the transmission circuit 36 according to the enabled transmission control signal HDOEN. At the time, a corresponding strobe signal HDSTBt is also transmitted. Then, the adjusting circuit 20 adjusts the timing relationship of the received testing signal HDt and the received strobe signal HDSTBt. Finally, the receiving circuit 18 reads out the received testing signal HDt according to the received strobe signal HDSTBt. By comparing the transmitted testing signal HDt and the received testing signal HDt, the high speed input and output functions of the chip 10 is identified. In briefly, the testing signal HDt is transmitted and received via the inner loop path in the high speed bus interface circuit 12. Furthermore, the receiving circuit 18 could directly receive the testing signal HDt (i.e. from the transmission circuit 16) and the strobe signal HDSTBt (not shown in FIG. 3) or via the data connecting circuit 22 and the strobe signal connecting circuit 24, respectively. Otherwise, the testing signal HDt could be obtained from the low speed bus 26.

Figure 4:
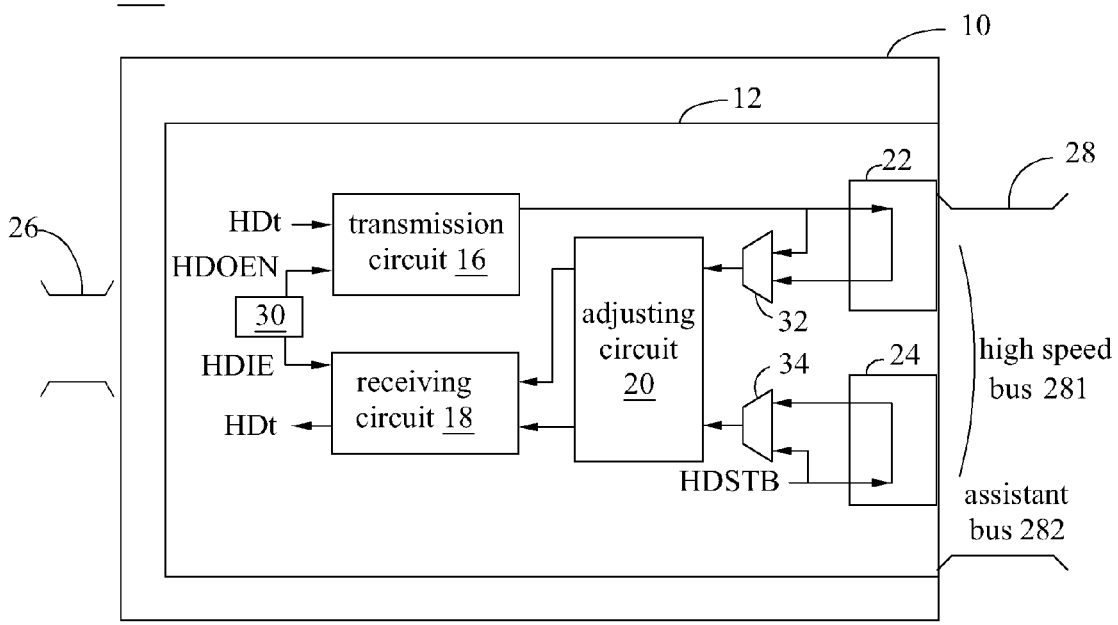
FIG. 4 is a schematic diagram of the testing system according to the embodiment of the present invention.

FIG. 4 shows a schematic diagram of the testing system 400 for the chip 10 according to the second embodiment in the present invention. The testing system 400 is similar to the testing system 200 excepting further includes a first multiplexer 32 and a second multiplexer 34. As shown in FIG. 4, the first multiplexer 32 is connected between the transmission circuit 16, the adjusting circuit 20 and the data connecting circuit 22. The first multiplexer 32 selects the testing signal HDt directly from the transmission circuit 16 or via the data connecting circuit 22. Also as shown in FIG. 4, the second multiplexer 34 is connected between the strobe signal connecting circuit 24. The second multiplexer 34 selects the testing strobe signal HDSTBt directly from the high speed bus interface circuit 12 or via the strobe signal connecting circuit 24.

The present invention provides a testing system and a testing method for a chip with high speed I/O functions. In the present invention, while testing the chip, both the transmission mechanism and the receiving mechanism are enabled; therefore, the testing signal could be transmitted and received via an inner loop path within the chip. Furthermore, while normally operating the chip, either the transmission mechanism or the receiving mechanism are enabled at a time; therefore, data could be transmitted to the high speed bus or data could be received from the high speed bus.

In summary, with compare to the conventional expensive high speed testing system and method, the cost is decreased in the present invention.

Although the present invention has been described with reference to specific embodiments thereof, it will be understood that the invention is not limited to the details thereof. Various substitutions and modifications have suggested in the foregoing description, and other will occur to those of ordinary skill in the art. Therefore, all such substitutions and modifications intended to be embraced within the scope of the invention as defined in the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a chip, wherein the chip is connected with a high speed bus and a low speed bus, the method comprising:
    enabling either a transmission mechanism or a receiving mechanism of the chip while normally operating the chip, wherein an output of the transmission mechanism is electrically connected to an input of a data connecting circuit, a multiplexer has a first input electrically connected to the output of the transmission mechanism, a second input electrically connected to an output of the data connecting circuit, and an output coupled to the receiving mechanism, wherein the output of the data connecting circuit is coupled to the high speed bus;
    enabling both of the transmission mechanism and the receiving mechanism of the chip while testing the chip;
    transmitting, with the transmission mechanism, a testing signal;
    receiving, with receiving mechanism, the testing signal transmitted by the transmission mechanism and a strobe signal while testing the chip;
    reading, with the receiving mechanism, the testing signal according to the strobe signal; and
    controlling the multiplexer, while testing the chip, to selectively output the testing signal from the transmission mechanism or the testing signal from the data connecting circuit to the receiving mechanism, wherein testing the chip comprises selectively testing the data connecting circuit by controlling the multiplexer.

2. The method according to claim 1 wherein the transmission mechanism is enabled according to a transmission control signal; and the receiving mechanism is enabled according to a receiving control signal.

3. The method according to claim 2 wherein either the transmission control signal or the receiving control signal is enabled while normally operating the chip.

4. The method according to claim 2 wherein both of the transmission control signal and the receiving control signal are enabled while testing the chip.

5. The method according to claim 1 further comprising transmitting data to the high speed bus and receiving data from the high speed bus while normally operating the chip.

6. The method according to claim 1 wherein transmitting the testing signal and receiving the testing signal via an inner loop path while testing the chip.

* * * * *